United States Patent [19]

Robertson

[11] Patent Number: 5,572,473
[45] Date of Patent: Nov. 5, 1996

[54] BIT LINE CONDITIONING CIRCUIT FOR RANDOM ACCESS MEMORY

[75] Inventor: Peter D. Robertson, Fremont, Calif.

[73] Assignees: Sony Corporation of Japan; Sony Electronics, Inc., Park Ridge, N.J.

[21] Appl. No.: 346,529

[22] Filed: Nov. 29, 1994

[51] Int. Cl.⁶ .................................................. G11C 7/00
[52] U.S. Cl. ........................................ 365/202; 365/203
[58] Field of Search ................................ 365/182, 202, 365/203, 204, 190

[56] References Cited

U.S. PATENT DOCUMENTS

| | | | |
|---|---|---|---|
| 4,658,381 | 4/1987 | Reed et al. | 365/203 |
| 4,813,022 | 3/1989 | Matsui et al. | 365/203 |
| 4,893,278 | 1/1990 | Ito | 365/203 |
| 5,047,985 | 9/1991 | Miyaji | 365/239 |
| 5,091,889 | 2/1992 | Hamano et al. | 365/203 |
| 5,233,560 | 8/1993 | Foss et al. | 365/203 |
| 5,355,343 | 10/1994 | Shu et al. | 365/203 |

Primary Examiner—Tan T. Nguyen
Attorney, Agent, or Firm—Irell & Manella LLP

[57] ABSTRACT

A bit line conditioning circuit for a random access memory (RAM) is provided. A pair of driver transistors maintain the bit line and bit line inverse at a high voltage before a memory cell is accessed. When a memory cell is accessed, the driver transistors are turned off such that the memory cell is accessed when the bit line and bit line inverse are not statically loaded. Since the bit line and bit line inverse are not statically loaded when the access is initiated, a read or write operation occurs more quickly than in a prior art RAM. An equalization transistor is coupled across the bit line and bit line inverse, and is turned on when a memory access is initiated to equalize the value over the bit line and bit line inverse.

8 Claims, 2 Drawing Sheets

PRE
EQ
ACC

CONDITION
ACCESS

BIT LINE CONDITIONING CIRCUIT FOR RANDOM ACCESS MEMORY

BACKGROUND OF THE INVENTION

1. Field of the Invention

The invention relates to integrated circuit memories and, more specifically, to a method and apparatus for conditioning bit lines in random access memory ("RAM") blocks.

2. Art Background

Random access memories (RAM) are common devices used in computers and many other digital systems. RAM memories typically comprise an array of rows (word lines) and columns, which further comprise bit lines and bit line inverses. Each memory cell (or bit) in the RAM is coupled across a bit line and a bit line inverse. The respective values on the bit line and bit line inverse determine what value will be written to a memory cell in a write operation, or what value will be read from a memory cell in a read operation. A memory cell is accessed by enabling the word line associated with that cell.

Before a memory cell is accessed, for both read and write operations, both the bit line and the bit line inverse of the column of the memory cell being accessed must be pulled high. Also, the voltage across the bit line and the bit line inverse must be equalized. In the prior art, two driver transistors pull the bit line and bit line inverse high and one transistor equalizes the voltage on the bit line and bit line inverse. The gates of all three transistors are provided with a precharge/equalization signal to pull the bit line and bit line inverse high and equalize the voltage between the bit line and bit line inverse. After the bit line and bit line inverse are pulled high and equalized, the memory cell is accessed through its associated word line. Since the driver transistors are typically off, two additional static load transistors are required.

The prior art circuit results in various inefficiencies. First, the two additional transistors increase the size of the RAM. Further, the bit line and bit line inverse are loaded with these two static load transistors and the two driver transistors when the memory cell is accessed. The loading of the bit line and bit line inverse increases the amount of time required to change the value over the bit line and bit line inverse, and thus increases the time required for a read or a write to a memory cell.

The present invention overcomes the limitations of the prior art by providing a bit line conditioning circuit that allows for faster read and write operations and does not require the two static load transistors, thereby decreasing the size of the RAM relative to the prior art.

SUMMARY OF THE INVENTION

A bit line conditioning circuit for a random access memory (RAM) is provided. A pair of driver transistors maintain the bit line and bit line inverse at high voltages before a memory cell is accessed. When a memory cell is accessed, the driver transistors are turned off such that the memory cell is accessed when the bit line and bit line inverse are not statically loaded. Since the bit line and bit line inverse are not statically loaded when the access is initiated, a read or write operation occurs more quickly than in a prior art RAM. An equalization transistor is coupled across the bit line and bit line inverse, and is turned on when a memory access is initiated to equalize the value over the bit line and bit line inverse.

DETAILED DESCRIPTION OF THE INVENTION

The present invention discloses a bit line conditioning circuit for a random access memory (RAM). Although the present invention is described with reference to specific circuits, block diagrams, and signals, etc., it will be appreciated by one of ordinary skill in the art that such details are disclosed simply to provide a more thorough understanding of the present invention. It will therefore be apparent to one skilled in the art that the present invention may be practiced without these specific details. In other instances, well known circuits are shown in block diagram form in order not to obscure the present invention unnecessarily.

Figure 1:
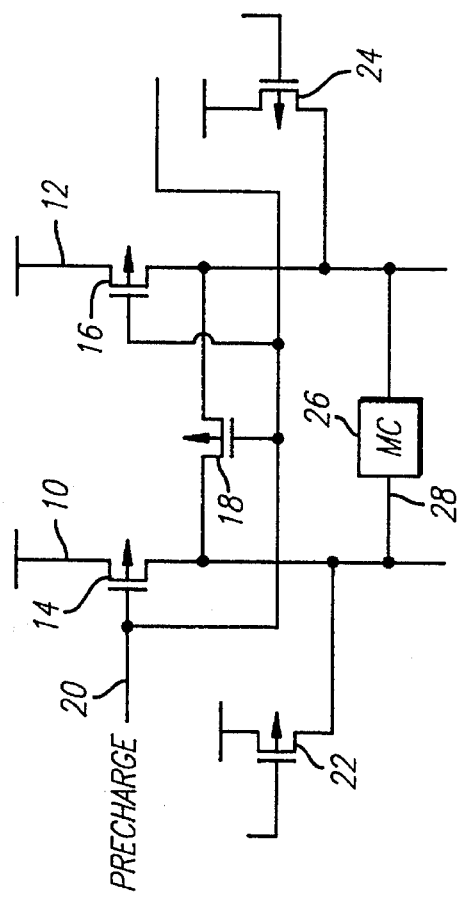
FIG. 1 is a prior art bit line conditioning circuit where driver transistors and equalization transistors are turned on and off simultaneously.

FIG. 1 is an illustration of a prior art bit line conditioning circuit. As illustrated in the figure, a memory cell 26 is coupled across a bit line ("BL") 10 and a bit line inverse ("$\overline{BL}$") 12. Access to the memory cell 26 is provided by a signal over a word line 28. For purposes of illustration, the figure shows only one memory cell 26. Typically, each BL 10 and $\overline{BL}$ 12 are coupled to a plurality of memory cells.

Before accessing the memory cell 26 over word line 28, the $\overline{BL}$ 10 and the BL 12 must be driven to a high voltage. Further, the $\overline{BL}$ 10 and BL 12 must have equal voltages. According to the prior art circuit as illustrated in FIG. 1, the BL 10 and the $\overline{BL}$ 12 are driven high by a pre-charge circuit comprising transistors 14, 16, and 18. As illustrated in the figure, transistors 14, 16, and 18 are P-type CMOS transistors. As will readily be appreciated by one of ordinary skill in the art, the circuit may be implemented with N-type CMOS transistors or other types of transistors. A pre-charge signal is provided to transistors 14, 16, and 18 over a line 20, which is coupled to the gates of transistors 14, 16, and 18. When a memory cell is not being accessed, the pre-charge signal provides a high voltage to the gates of transistors 14, 16, and 18 so the transistors 14, 16, and 18 are normally off. Before the memory cell 26 is accessed, the BL 10 and $\overline{BL}$ 12 are driven high and equalized when the pre-charge signal over line 20 goes low. When the pre-charge signal over line 20 goes low, transistors 14, 16, and 18 are turned on. Thus, the BL 10 and the $\overline{BL}$ 12 are pulled high by the transistors 14 and 16 respectively. The transistor 18 coupled across the BL 10 and the $\overline{BL}$ 12 ensures that the voltages on both the BL 10 and $\overline{BL}$ 12 are equal.

After the BL 10 and $\overline{BL}$ 12 have been pulled high and equalized, the memory cell 26 may be accessed over the word line 28. Memory cell 26 access, however, usually occurs while the transistors 14, 16, and 18 are turned on such that the BL 10 and $\overline{B}$ 12 are statically loaded during the access. The static load increases the amount of time required to access the memory cell As previously described, when a memory cell is not being accessed, the pre-charge signal provides a high voltage to the gates of transistors 14, 16, and 18 so the transistors 14, 16, and 18 are normally off. A pair of transistors 22 and 24 are required to provide a static load for the BL 10 and $\overline{BL}$ 12 during those times when the memory cell 26 is not being accessed since the transistors 14 and 16 are off. The static load provided by the transistors 22 and 24, however, further increases the amount of time required to access the memory cell 26 during a read or write operation.

Figure 3B:
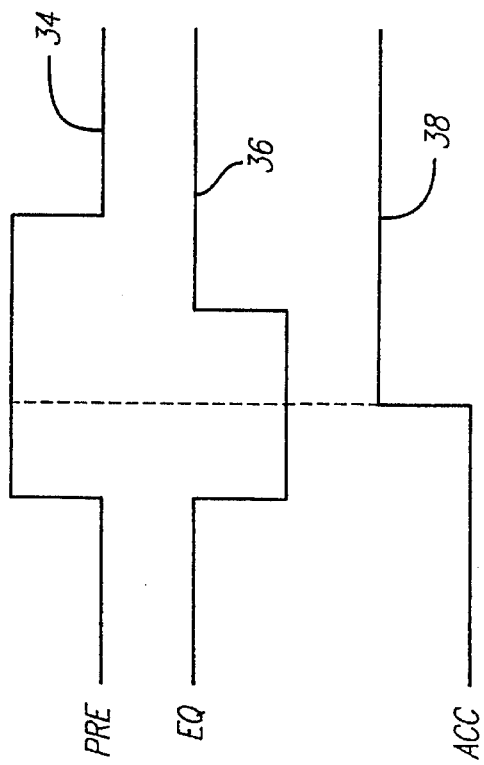
FIG. 3b is a timing diagram for the circuit of FIG. 2.
Figure 3A:
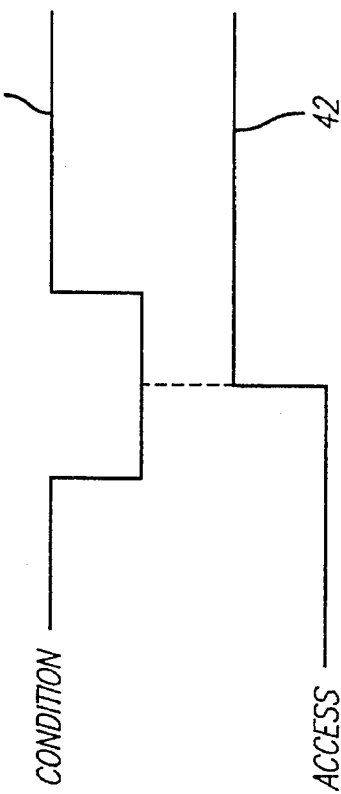
FIG. 3a is a timing diagram for the circuit of FIG. 1.

FIG. 3a illustrates the timing of the circuit of FIG. 1. Signal 40 represents the signal provided to the transistors 14, 16, and 18 of FIG. 1. When a read or write is initiated, the signal 40 changes from a high voltage to a low voltage, thus turning on transistors 14, 16, and 18. Signal 42 represents the access signal over the word line 28. The access signal changes from a low voltage to a high voltage to enable the word line 28 while the transistors 14 and 16 are on. Thus, the access to memory cell 26 occurs while the BL 10 and $\overline{BL}$ 12 are statically loaded with transistors 14, 16, 22 and 24. This increases the amount of time required to access the memory cell 26.

Figure 2:
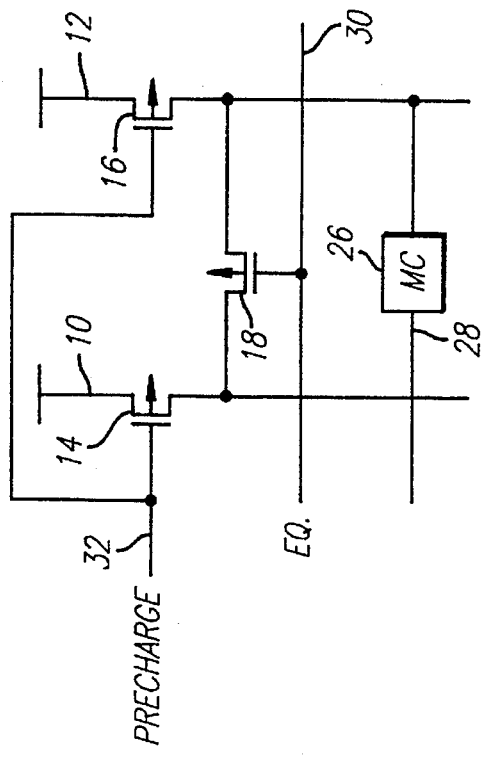
FIG. 2 is the bit line conditioning circuit of the present invention where the driver transistors are provided with a different signal than the signal provided to the equalization transistor.

FIG. 2 illustrates the bit line conditioning circuit of the present invention. As in the circuit of FIG. 1, the memory cell 26 is coupled across BL 10 and $\overline{BL}$ 12 and accessed through the word line 28. Also, the transistor 14 pulls the BL 10 high and the transistor 16 pulls the $\overline{BL}$ 12 high before the memory cell 26 is accessed. Transistor 18, as before, equalizes the value over BL 10 and $\overline{BL}$ 12. Unlike the circuit of FIG. 1, however, the transistors 14 and 16 are provided with a pre-charge signal over line 32. The transistor 18 is coupled to an equalization signal over line 30. The pre-charge signal and the equalization signal are not identical, in contrast to the prior art which employs only one signal to pre-charge the BL 10 and $\overline{BL}$ 12 and equalize the value over the BL 10 and the $\overline{BL}$ 12.

FIG. 3b is a timing diagram for the circuit illustrated in FIG. 2. Signal 34 represents the voltage on line 32 as illustrated in FIG. 2, signal 36 represents the voltage on line 30 as illustrated in FIG. 2, and signal 38 is the access signal provided over line 28. As illustrated in the timing diagram of FIG. 3b, the pre-charge signal 34 is provided to the gates of transistors 14 and 16 while the equalization signal 36 is provided to the gate of transistor 18. The pre-charge signal 34 is typically low such that the transistors 14 and 16 are normally on. This obviates the need for static load transistors. When a read or write is initiated, the pre-charge signal 34 changes from a low voltage to a high voltage, as illustrated in FIG. 3b, which turns off the transistors 14 and 16. Conversely, the equalization signal 36 which is provided to transistor 18 over line 30 is normally at a high voltage such that the transistor 18 is normally off.

When a read or write is initiated, the equalization signal 36 changes from a high voltage to a low voltage, thus turning on transistor 18 and equalizing the voltage between the BL 10 and the $\overline{BL}$ 12. While the pre-charge signal 34 over line 32 is still at a high voltage, the access signal 38 over line 28 changes from a low voltage to a high voltage to enable the word line 28 such that the memory cell 26 is accessed. Since the access occurs at a time when the transistors 14 and 16 are off, the access occurs without a static load and is thus faster than if a static load were present. In this manner, the circuit of FIG. 2 and the timing of the signals as illustrated in FIG. 3b decrease the amount of time required for the memory cell 26 to be accessed and also reduce the size of the RAM compared to the circuit illustrated in FIG. 1.

While the invention has been described in conjunction with the preferred embodiment, it is evident that numerous alternatives, modifications, variations and uses will be apparent to those skilled in the art in light of the foregoing description. For example, the memory may be implemented with transistor-transistor logic or other types of digital logic. Many other adaptations of the present invention are possible.

I claim:

1. A method for conditioning bit lines in a random access memory with at least two bit line driver transistors, an equalization transistor coupled across the bit lines and a word line coupled to a memory cell, the method comprising the steps of:

for at least a portion of a period wherein said memory cell is not being accessed, turning on the driver transistors to provide a static load;

providing a pre-charge signal to turn off the driver transistors before said memory cell is accessed to remove the static load;

after the step of turning off the driver transistors, enabling the word line to access the memory cell; and changing the value of the pre-charge signal to turn on the driver transistors while the word line is enabled.

2. The method according to claim 1 further comprising the step of changing the value of the pre-charge signal to turn on the driver transistors while the word line is enabled.

3. A method for conditioning bit lines in a random access memory with at least two bit line driver transistors, an equalization transistor coupled across the bit lines and a word line coupled to a memory cell, the method comprising the steps of;

for at least a portion of a period wherein said memory cell is not being accessed, turning on the driver transistors to provide a static load;

providing a pre-charge signal to turn off the driver transistors before said memory cell is accessed to remove the static load;

after the step of turning off the driver transistors, enabling the word line to access the memory cell; and providing an equalization signal to turn on the equalization transistor upon initiating a memory access operation.

4. The method according to claim 3 further comprising the step of changing the value of the equalization signal to turn off the equalization transistor while the driver transistors are on.

5. An integrated circuit random access memory (RAM) with memory cells, the memory cells accessed through word lines and the memory cells coupled across a bit line ("BL") and a bit line inverse ("$\overline{BL}$"), said RAM comprising:

a BL driver transistor coupled in series with the BL, the gate of the BL driver transistor coupled to a first line;

a $\overline{BL}$ driver transistor coupled in series with the $\overline{BL}$, the gate of the $\overline{BL}$ driver transistor coupled to a second line;

an equalization transistor coupled across the BL and the $\overline{BL}$, the gate of the equalization transistor coupled to a third line, the third line distinct from the first line and the second line;

wherein said driver transistors are on during a portion of a period in between memory access operations, thereby acting as static loads in between memory access operations; and wherein said equalization transistor is turned on after a memory access operation is initiated.

6. An integrated circuit random access memory (RAM) with memory cells, the memory cells accessed through word lines and the memory cells coupled across a bit line ("BL") and a bit line inverse ("$\overline{BL}$"), said RAM comprising:

- a BL driver transistor coupled in series with the BL, the gate of the BL driver transistor coupled to a first line;
- a $\overline{BL}$ driver transistor coupled in series with the $\overline{BL}$, the gate of the $\overline{BL}$ driver transistor coupled to a second line;
- an equalization transistor coupled across the BL and the $\overline{BL}$, gate of the equalization transistor coupled to a third line, the third line distinct from the first line and the second line;
- wherein said driver transistors are on during a portion of a period in between memory access operations, thereby acting as static loads in between memory access operations; and
- wherein said driver transistors are turned off after a memory access operation is initiated.

7. A method for conditioning bit lines in a random access memory with at least two bit line driver transistors, an equalization transistor coupled across the bit lines and a word line coupled to a memory cell, the method comprising the steps of:

- providing an equalization signal to said equalization transistor such that said equalization transistor is turned on at the beginning of a memory access operation; and
- while said equalization transistor is on, providing a precharge signal such that said driver transistors are off.

8. The method of claim 7 further comprising the step of turning off said equalization transistor before turning on said driver transistors.

* * * * *